United States Patent
Li et al.

(10) Patent No.: US 7,154,750 B2
(45) Date of Patent: Dec. 26, 2006

(54) PRINTED CIRCUIT BOARD HAVING COOLING MEANS INCORPORATED THEREIN

(75) Inventors: Nien-Lun Li, Hsin-Chuang (TW); Fu-Yin Wang, Hsin-Chuang (TW); Ya-Hui Wu, Hsin-Chuang (TW); Jian-Xuan Lee, Hsin-Chuang (JP)

(73) Assignee: Datech Technology Co., Ltd., Taipei Hsien (TW)

( * ) Notice: Subject to any disclaimer, the term of this patent is extended or adjusted under 35 U.S.C. 154(b) by 160 days.

(21) Appl. No.: 10/912,337

(22) Filed: Aug. 6, 2004

(65) Prior Publication Data
US 2006/0028796 A1   Feb. 9, 2006

(51) Int. Cl.
*H05K 7/20* (2006.01)
*F04B 39/02* (2006.01)
*F04B 17/00* (2006.01)

(52) U.S. Cl. ............. 361/695; 361/719; 415/175; 415/213.1; 417/423.14; 417/423.15; 417/368

(58) Field of Classification Search .......... 361/704, 361/719, 720, 748, 760, 761; 415/175, 213.1
See application file for complete search history.

(56) References Cited

U.S. PATENT DOCUMENTS

| 6,356,452 | B1* | 3/2002 | Rumsey ............... 361/760 |
| 6,394,768 | B1* | 5/2002 | Fukuda et al. ........ 417/423.15 |
| 6,951,449 | B1* | 10/2005 | Huang et al. ........... 417/368 |
| 6,977,346 | B1* | 12/2005 | Jairazbhoy et al. ....... 174/252 |

* cited by examiner

*Primary Examiner*—Boris Chervinsky
(74) *Attorney, Agent, or Firm*—Troxell Law Office, PLLC

(57) ABSTRACT

The present invention is a printed circuit board having cooling means incorporated therein, which is coordinated with a fan. The fan comprises a frame, a stator, a rotator and a circuit board. The circuit board comprises at least one electronic component, a control IC and a heat discharge region. The heat discharge region comprises two heat dissipation areas with a plurality of holes; and the control IC is at a position corresponding to the heat discharge region. Accordingly, the circuit board can be ventilated and its heat-transfer structure can be destroyed to further obtain a better heat discharge so that the work efficiency of the control IC can be improved.

5 Claims, 9 Drawing Sheets

PRINTED CIRCUIT BOARD HAVING COOLING MEANS INCORPORATED THEREIN

FIELD OF THE INVENTION

The present invention relates to a printed circuit board having cooling means incorporated therein. More particularly, it relates to a circuit board with ventilation and its heat-transfer structure is eliminated so that the heat discharge efficiency is better and the work efficiency of the control IC (integrated circuit) is improved.

DESCRIPTION OF THE RELATED ART

As is known, the prior art as disclosed in "Fan circuit board and fan structure with fan circuit board", Patent Number 566828, Taiwan, comprises an electrical component area on a first surface of the circuit board of a fan with a heating component; and a heat dissipation film connected with the heating component at the rim of the first surface.

As shown in the FIG. 6 and the FIG. 7 of the patent document, the circuit board 100 comprises an electrical component area 102 and a heat dissipation film 106, wherein the heat dissipation film 106 is at the rim of the circuit board 100. The electrical component area 102 comprises a circuit driving a motor element, semi-conductor elements, ICs (integrated circuits) and related elements. A part of the elements are heating components 104 that will generate heat, such as the ICs and the semi-conductor elements.

The heat dissipation film 106 is connected with the heating components 104 for dissipating the heat they generated; and, at the same time, by the wind channel of the fan structure 200 itself, the heat from the heat dissipation film 106 is quickly dissipated from the fan structure 200. The heat dissipation film 106 can be a film covered by a heat-dissipating material made of copper, aluminum, iron or any other alloy that can dissipate heat.

The heat dissipation film 106 can be around the electrical component area 102 or at any place on the circuit board 100 other than the electrical component area 102. Or, the heat dissipation film 106 can be extended out of the hub 202 or can be in the hub 202. When the heat dissipation film 106 is extended out of the hub 202, because the heat dissipation film 106 is on the wind channel of the fan structure 200, the heat from the heat dissipation film 106 can be quickly carried away by the air passed through the heat dissipation film 106. Therefore, the electric current capacity of the component on the circuit board 100 can be greatly improved and the fan structure 200 can be prolonged on usage.

In addition, as shown in the FIG. 8, a plurality of holes 108 can be made on the heat dissipation film 106. The holes 108 are rather in a dissymmetrical arrangement. In the preferred embodiment, because the holes 108 can be part of the wind channels of the fan structure 200, the heat from the heat dissipation film 106 can be more quickly carried out by the air passed through the holes 108. This preferred embodiment can further improve the current capacity of the component on the circuit board 300 so that the fan structure 200 can be prolonged on usage.

The above structure can improve the electric current capacity of the component on the circuit board and further prolong the usage period of the fan structure. The main heating sources of the circuit board are the heating components on it, such as ICs or semi-conductor components. By the wind channel of the fan structure itself and the heat dissipation film around the rim of the circuit board or around the whole circuit component or at any area on the circuit board other than the circuit component area, the heat generated by the heating component can be dissipated to the heat dissipation film and can be quickly carried away from the fan structure. Although along with the above benefits, the heat discharge efficiency is still limited because the heat-discharging of the heating component is in an indirect way which transfers heat first and then guides the air flow.

Besides, although there can be a plurality of holes on the heat dissipation film to be a part of wind channels of the wind structure, the holes do not directly guide the air flow to the heating component so that the heat discharge efficiency is not good enough. So, the heat dissipation structures according to the prior art do not fully meet the requirements of the users.

SUMMARY OF THE INVENTION

Therefore, the main purpose of the present invention is to provide a heat-discharging structure for the circuit board. More particularly, it relates to a heat discharge region on the circuit board for obtaining the effects of the ventilation on the circuit board and the elimination of the heat-transfer structure so that the circuit board can further obtain a better heat discharge efficiency to improve the work efficiency of the control IC (integrated circuit).

In order to achieve the above purpose, the present invention is a heat dissipation structure for a circuit board which is coordinated with a fan. The fan comprises a frame, a stator, a rotor and a circuit board. A supporter is at the center of the frame and a sleeve is extended out from the supporter. The stator is socketed around the sleeve and is on the supporter. The rotor is movably jointed in the frame, comprising a spindle at the center to be plugged into the sleeve. The circuit board socketed around the sleeve is between the stator and the supporter, comprising at least one electronic component and a control IC. And the circuit board comprises a heat discharge region at a position corresponding to the control IC; and the heat discharge region comprises two heat dissipation areas with a plurality of holes. Accordingly, by the heat discharge region, the circuit board can be ventilated and its heat-transfer structure can be eliminated to further obtain a better heat discharge so that the work efficiency of the control IC can be improved.

BRIEF DESCRIPTIONS OF THE DRAWINGS

The present invention will be better understood from the following detailed description of preferred embodiments of the invention, taken in conjunction with the accompanying drawings, in which FIG. 1 is a perspective view of a fan according to the present invention;

DESCRIPTION OF THE PREFERRED EMBODIMENT

Figure 1:
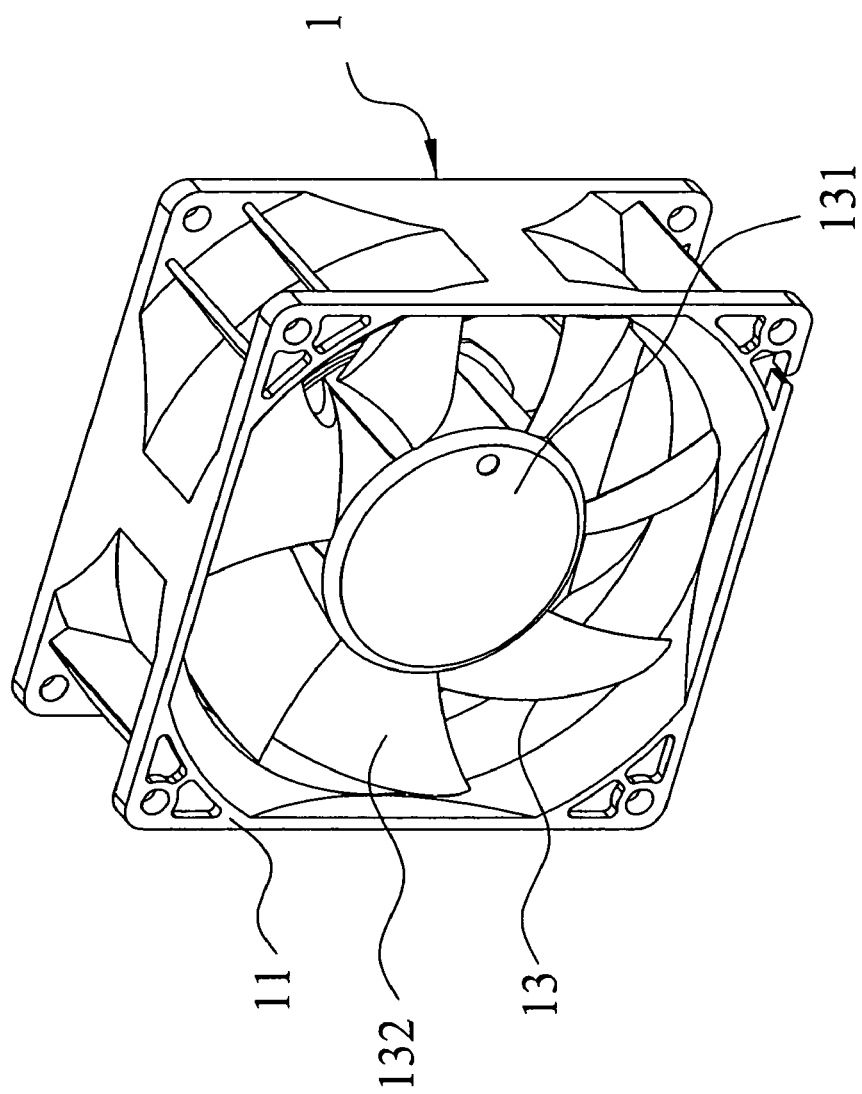
Figure 2:
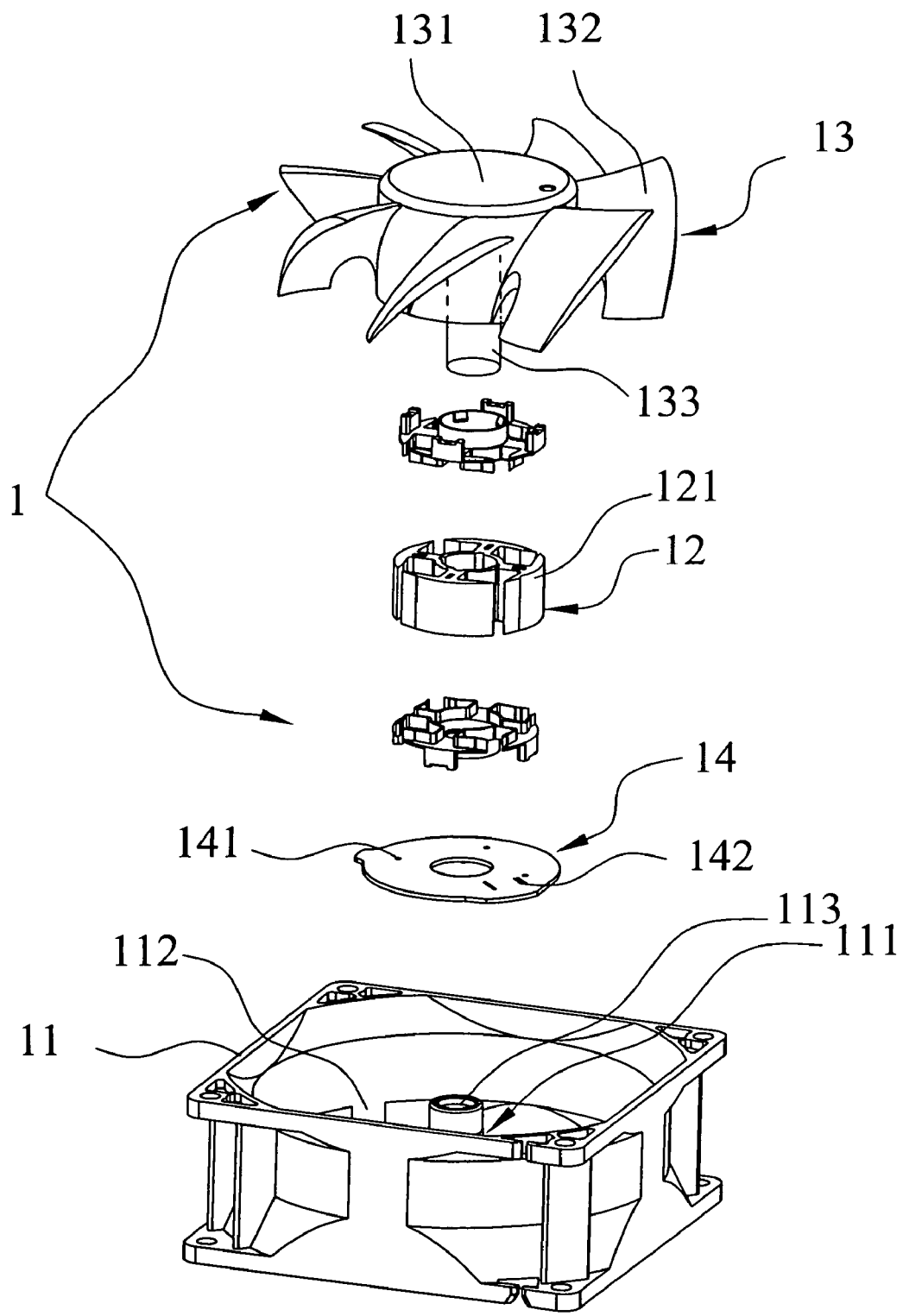
FIG. 2 is a view showing the structure of a fan according to the present invention.

The following descriptions of the preferred embodiment are provided to understand the features and the structures of the present invention.

Please refer to FIG. 1 through FIG. 4, which are a perspective view, a view showing the structure, a perspective view of the circuit board and a view showing the structure of the circuit board, according to the present invention. As shown in the figures, the present invention is a printed circuit board having cooling means incorporated therein, which is coordinated with a fan. The fan 1 can be a temperature-controlled fan, comprising a frame 11, a stator 12, a rotor 13 and a circuit board 14.

A supporter 111 is at the center of the frame 11 with at least one brace 112 connected with the frame around the supporter 111 and a sleeve is extended out from a surface of the supporter 111. The stator 12 comprises a coil set 121 and is socketed around the sleeve 113 and is on the supporter 111. The rotor 13 is movably jointed in the frame 1, comprising a hub body 131 and at least one blade 132 around the hub body. A spindle 133 is at the center of the hub body 131 to be plugged into the sleeve 113.

The circuit board 14 socketed around the sleeve 113 is between the stator 12 and the supporter 111, comprising at least one electronic component 141 and a control IC (integrated circuit), wherein the control IC is a heating component. The preferred embodiment according to the present invention uses a temperature-controlled fan. The fan uses an NTC (negative temperature coefficient) connected to the control IC 142 as a temperature sensor. The control IC is a P-MOS (positive-channel metal-oxide-semiconductor) IC as a switch to control the rotation speed of the fan 1. The circuit board 14 comprises a heat discharge region 2 at a position corresponding to the control IC 142. The heat discharge region 2 comprises two heat dissipation areas 21,22. The heat dissipation area 21,22 comprises a plurality of holes 23 orderly arranged. After the control IC 142 is set on the circuit board 14, the two heat dissipation areas 21,22 can be set around the control IC 142 at two sides. Accordingly, the circuit board 14 can be ventilated and its heat-transfer structure can be eliminated to further obtain a better heat discharge so that the work efficiency of the control IC 142 can be improved. By the above structure, a novel printed circuit board having cooling means incorporated therein is obtained.

Figure 3:
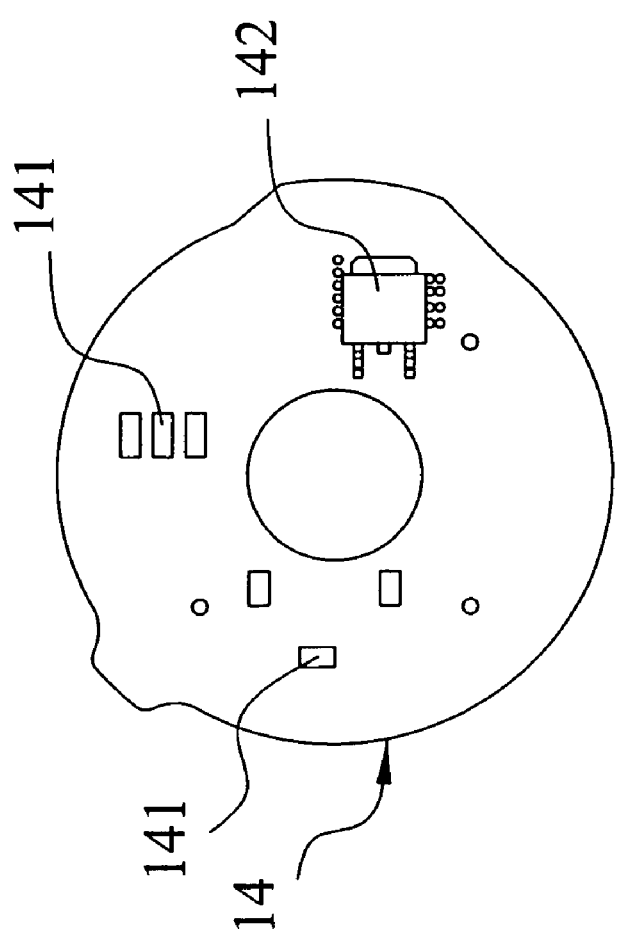
FIG. 3 is a perspective view of the circuit board according to the present invention.
Figure 4:
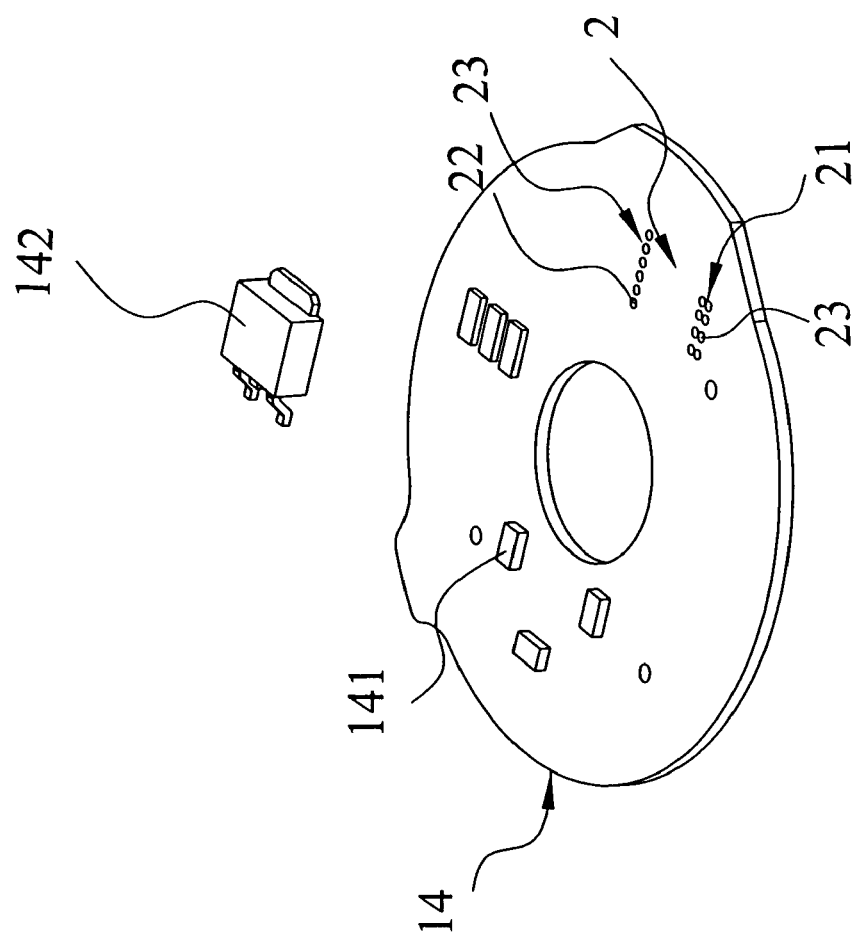
FIG. 4 is a view showing the structure of the circuit board according to the present invention.
Figure 5:
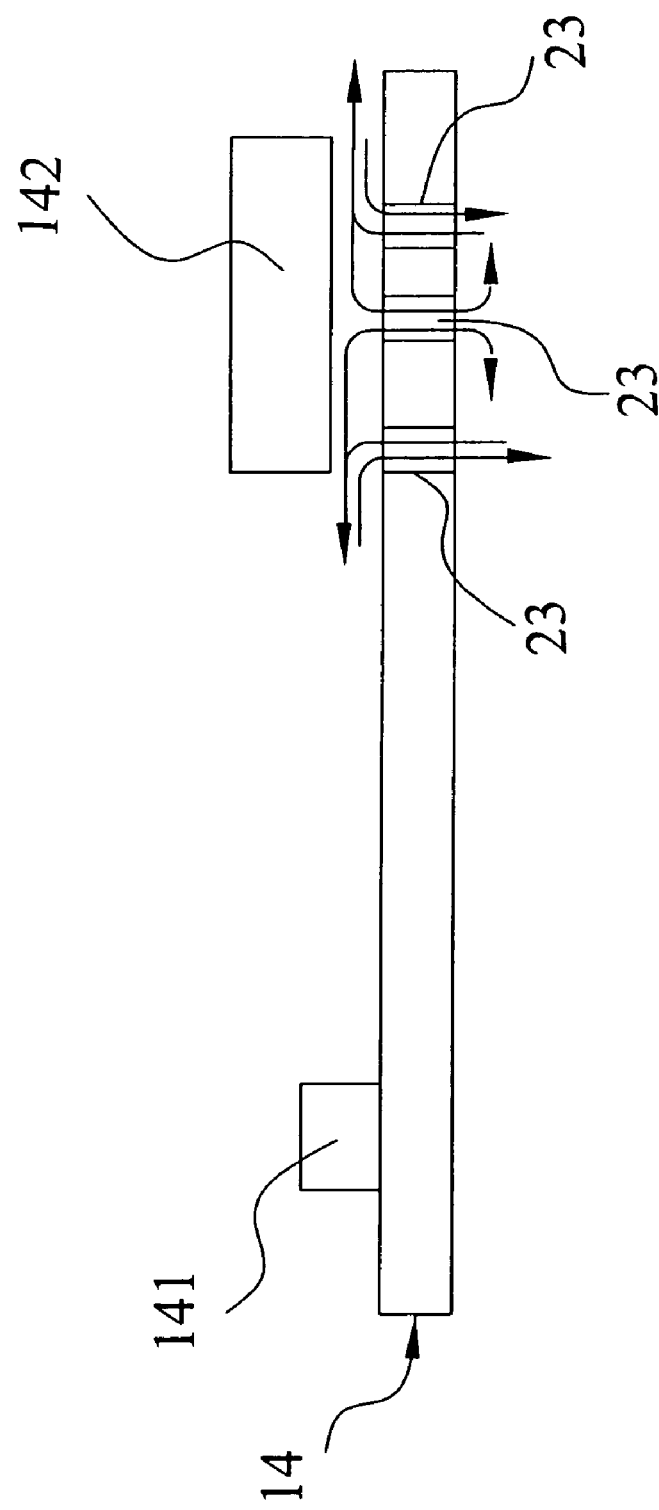
FIG. 5 is a cross-sectional view of the circuit board according to the present invention.
Figure 6:
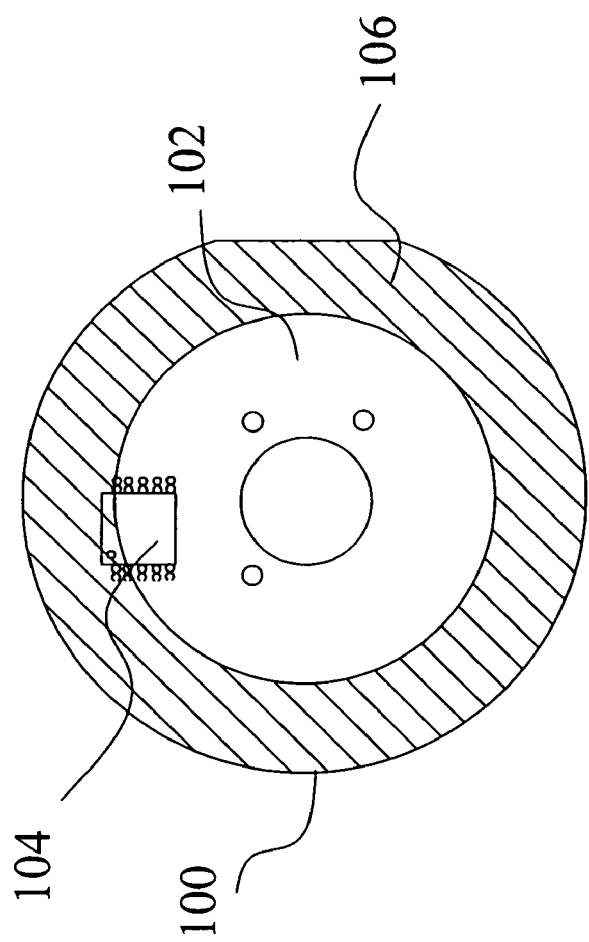
FIG. 6 is a perspective view of the circuit board according to the prior art.
Figure 7:
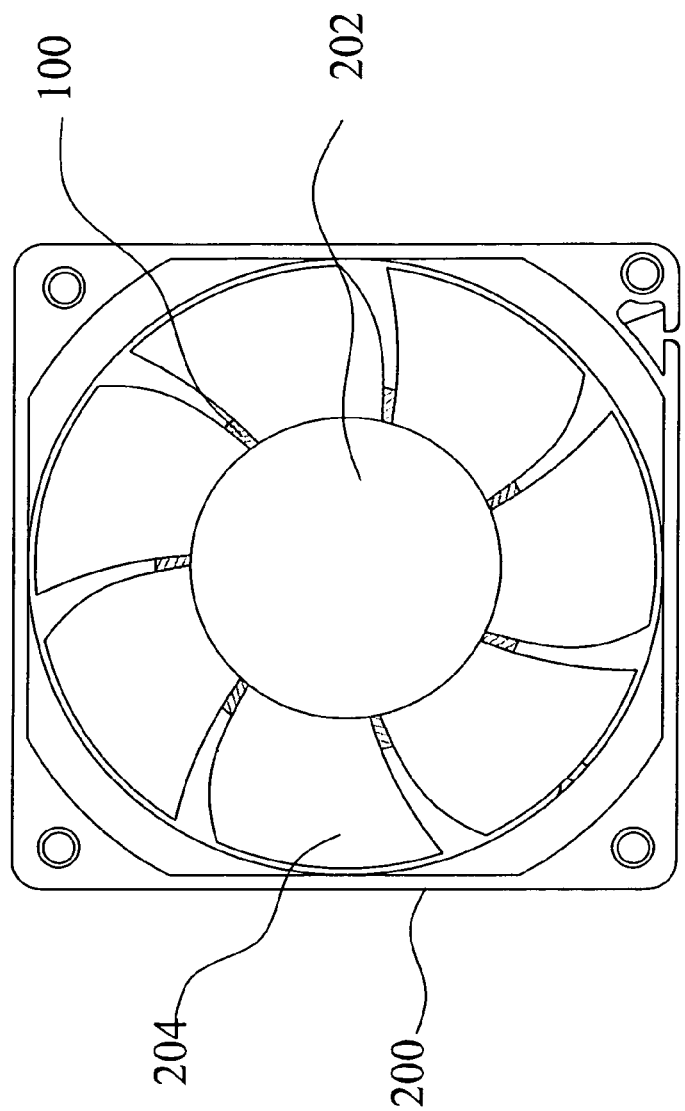
FIG. 7 is a perspective view of a fan according to the prior art.
Figure 8:
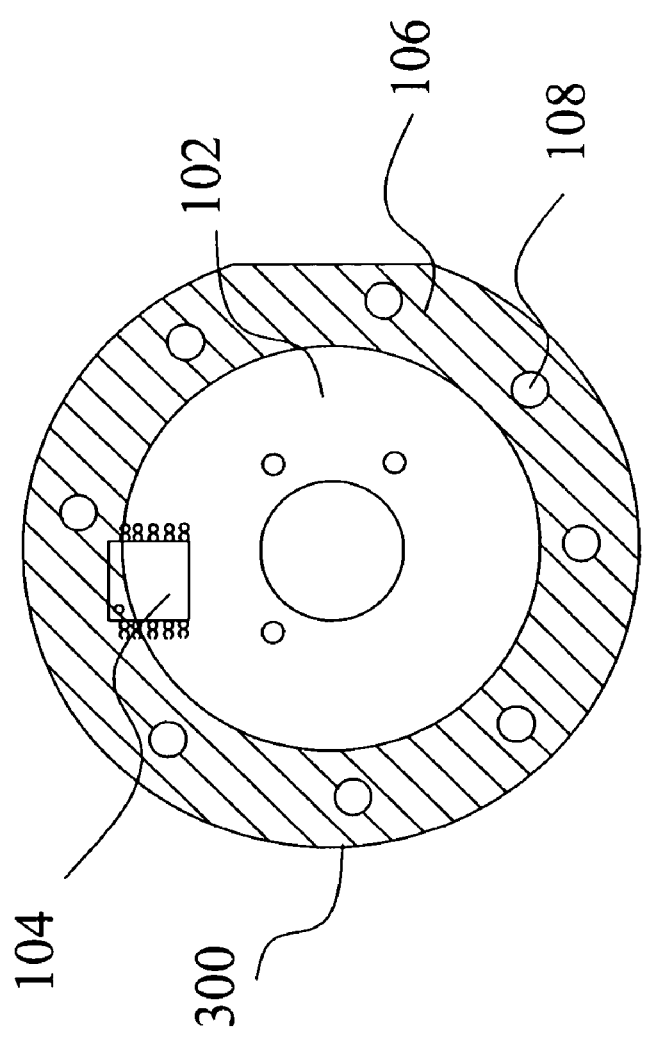
FIG. 8 is a perspective view of the circuit board with a plurality of holes on a heat dissipation film according to the prior art.
Figure 9:
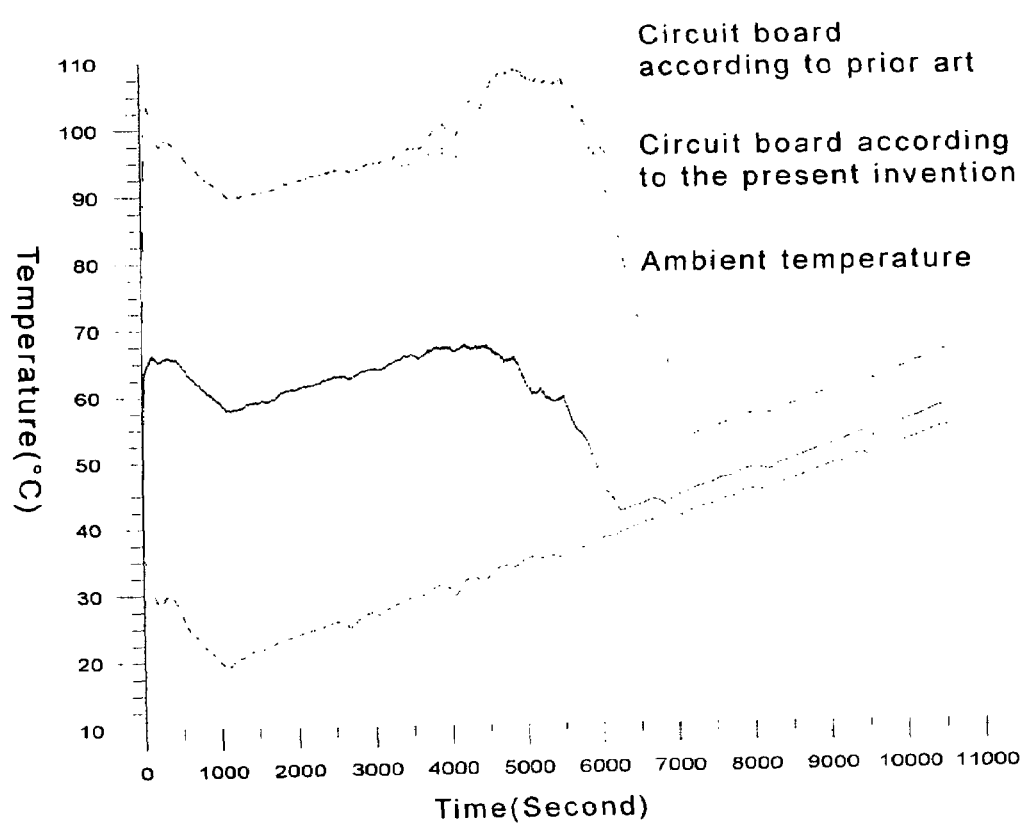
FIG. 9 is a diagram of the heat discharge curves according to the present invention and the prior art.

Please refer to FIG. 3 through FIG. 5, which are a perspective view of the circuit board, a view showing the structure of the circuit board and a cross-sectional view of the circuit board, according to the present invention. As shown in the figures, on assembling the fan 1 with the circuit board 14 according to the present invention, the pins of the control IC 142 are set at the default positions on the circuit board 14. The main body of the control IC 142 is at a position corresponding to the heat discharge region 2 set on the circuit board 14. A surface of the control IC 142 is corresponding to two heat dissipation areas 21,22 of the heat discharge region 2. As the fan 1 starts to rotate and so the control IC 142 starts to run as a heating component, the heat starts to be generated. Because the control IC 142 is at a position corresponding to the two heat dissipation areas 21,22 and the heat dissipation area comprises a plurality of holes orderly arranged, through the plurality of holes, the circuit board 14 can be ventilated and its heat-transfer structure can be eliminated to further obtain a better heat discharge so that the work efficiency of the control IC 142 can be improved. Please refer to FIG. 6, which is a diagram of the heat discharge curves according to the present invention and the prior art. As shown in the figure, the heat discharge efficiency of the circuit board according to the present invention is better than that according to the prior art.

To sum up, the printed circuit board having cooling means incorporated therein according to the present invention can effecttively overcome the disadvantages of the prior art. The heat-transfer structure is eliminated because of the setting of the heat discharge region 2 together with the ventilation on the circuit board 14 so that the work efficiency of the control IC 142 can be improved and the production according to the present invention is more advanced, more practical and more suitable for the user.

The preferred embodiment herein disclosed is not intended to unnecessarily limit the scope of the invention. Therefore, simple modifications or variations belonging to the equivalent of the scope of the claims and the instructtions disclosed herein for a patent are all within the scope of the present invention.

What is claimed is:

1. A cooled circuit structure comprising:
a fan frame with a supporter at center and with a sleeve extended from said supporter;
a stator socketed around said sleeve on said supporter;
a rotor movably jointed in said frame having a spindle to be plugged into said sleeve; and
a heatsinkless circuit board between said stator and said supporter, which comprises at least an electronic component and a control integrated circuit (IC) and is socketed around said sleeve, said circuit board being surrounded by said fan frame
wherein said control IC is located on said circuit board, said control IC overlying two heat dissipation areas having a plurality of holes for cooling said control IC.

2. The cooled circuit structure according to claim 1, wherein said control IC is a heating component.

3. The cooled circuit structure according to claim 1, wherein said heat dissipation area underlies said control IC on two opposite sides.

4. The cooled circuit structure according to claim 3, wherein said holes are aligned in two rows.

5. The cooled circuit structure according to claim 1, wherein a diameter of said rotor exceeds a diameter of said circuit board.

* * * * *